United States Patent
Mizuno

(10) Patent No.: US 7,088,494 B2
(45) Date of Patent: Aug. 8, 2006

(54) HINGE STRUCTURE OF MICROMIRROR DEVICE

(75) Inventor: Rogerio Jun Mizuno, Saitama-ken (JP)

(73) Assignee: PENTAX Corporation, Tokyo (JP)

( * ) Notice: Subject to any disclaimer, the term of this patent is extended or adjusted under 35 U.S.C. 154(b) by 0 days.

(21) Appl. No.: 11/042,157

(22) Filed: Jan. 26, 2005

(65) Prior Publication Data
US 2005/0162729 A1 Jul. 28, 2005

(30) Foreign Application Priority Data
Jan. 27, 2004 (JP) ............................. 2004-017907

(51) Int. Cl.
*G02B 26/00* (2006.01)
(52) U.S. Cl. .................................... 359/291
(58) Field of Classification Search ................ 359/291, 359/292, 293, 220, 223, 224, 320, 323; 310/309
See application file for complete search history.

(56) References Cited

U.S. PATENT DOCUMENTS

| 6,431,714 | B1 | 8/2002 | Sawada et al. | |
|---|---|---|---|---|
| 6,936,950 | B1 * | 8/2005 | Akagawa et al. | 310/309 |
| 6,995,499 | B1 * | 2/2006 | Hwang | 310/328 |
| 7,005,775 | B1 * | 2/2006 | Wan | 310/309 |
| 2003/0016906 | A1 | 1/2003 | Utsunomiya | |

FOREIGN PATENT DOCUMENTS

| JP | 2003-29172 | 1/2003 |
|---|---|---|
| JP | 2003-57575 | 2/2003 |

OTHER PUBLICATIONS

T. J. Brosnihan et al., The 12th International Conference on Solid State Sensors, Actuators and Microsystems, Boston, Jun. 8-12, 2003, IEEE, 2003, pp. 1638-1642.
U.S. Appl. No. 11/036,983 to Mizuno, which was filed on Jan. 19, 2005.

* cited by examiner

*Primary Examiner*—Hung X. Dang
*Assistant Examiner*—Tuyen Tra
(74) *Attorney, Agent, or Firm*—Greenblum & Bernstein, P.L.C.

(57) ABSTRACT

A hinge structure, for rotatably supporting a mirror surface of a micromirror device which rotates the mirror surface around at least an axis for scanning a beam, includes a linear body with one end joined to a surface which is rotated around the axis and the other end joined to a surface which does not rotate around the axis. The linear body includes a linear central part situated on the axis and a pair of extension parts extending from both ends of the central part to both ends of the linear body respectively to surround the central part in the same direction. The extension parts are formed so that space between them will be substantially constant. By the above composition, the hinge structure delivers high spring performance while being small-sized.

9 Claims, 7 Drawing Sheets

HINGE STRUCTURE OF MICROMIRROR DEVICE

BACKGROUND OF THE INVENTION

The present invention relates to a hinge structure for rotatably supporting a mirror surface of a micromirror device for scanning a beam.

Micromirror devices have widely been used in various technical fields like optical switches for communication, measuring instruments, scanners, etc. For example, in a micromirror device of a capacitance type, a mirror surface for scanning an incident beam is rotatably supported by a hinge structure having elasticity and a plurality of electrodes are arranged on a substrate placed under the mirror surface. By applying voltage to a proper electrode, electrostatic attraction is caused between the electrode and the mirror surface and thereby the mirror surface is tilted in a desired direction. In recent years, micromirror devices are being required to widen their beam scan range by tilting the mirror surface by a larger tilt angle. For this purpose, the hinge structure is required to improve its spring performance, that is, to bend or twist more flexibly. Under the circumstances, not only simple rod-like hinge structures but also various types of hinge structures have recently been proposed as disclosed in Japanese Patent Provisional Publication No.2003-29172 (hereinafter referred to as a "document No. 1"), for example.

A study of conventional hinge structures employing the finite element method, etc. has proved that the spring performance changes inversely proportional to the size of the hinge structure. For example, in a hinge structure of the so-called continuous z-fold type (thin material alternately folded in directions orthogonal to an axis) described in the document No. 1, the size of the hinge structure measured in a direction orthogonal to the rotation axis of the mirror surface has to be increased in order to improve the spring performance. However, designing the hinge structure too large can cause a drop in the strength of the whole mirror layer in which the mirror surface is formed.

SUMMARY OF THE INVENTION

The present invention is advantageous in that it provides a hinge structure for rotatably supporting a mirror surface of a micromirror device for scanning a beam, delivering high spring performance while being small-sized.

In accordance with an aspect of the present invention, there is provided a hinge structure for rotatably supporting a mirror surface of a micromirror device which rotates the mirror surface around at least an axis for scanning a beam. The hinge structure includes a linear body with one end joined to a surface which is rotated around the axis and the other end joined to a surface which does not rotate around the axis. The linear body includes a linear central part situated on the axis and a pair of extension parts extending from both ends of the central part to both ends of the linear body respectively to surround the central part in the same direction. The extension parts are formed so that space between them will be substantially constant.

In accordance with another aspect of the present invention, there is provided a hinge structure for rotatably supporting a mirror surface of a micromirror device which rotates the mirror surface around at least an axis for scanning a beam. The hinge structure includes a linear body with one end joined to a surface which is rotated around the axis and the other end joined to a surface which does not rotate around the axis. The linear body includes a linear central part situated on the axis, a first extension part extending from an end of the central part to the one end of the linear body to surround the central part in one of a clockwise direction and a counterclockwise direction, and a second extension part extending from the other end of the central part to the other of the linear body to surround the central part in the same direction as the first extension part. The first and second extension parts are formed so that space between them will be substantially constant.

From comparison between a micromirror device equipped with the hinge structures composed above and a micromirror device equipped with conventional hinge structures (e.g. the document No.1) employing the finite element method and equivalent circuit method, the following results were obtained. When a prescribed voltage was applied to both of the micromirror devices designed in the same dimensions, the micromirror device having the hinge structures in accordance with the present invention was capable of tilting the mirror surface by a larger angle. In order to achieve a prescribed tilt angle of the mirror surface with a prescribed voltage applied to the electrode, the conventional hinge structure needed a larger size compared to the hinge structure of the present invention.

According to the above comparison, the hinge structure in accordance with the present invention delivers higher spring performance (that is, the hinge structure can be bent or twisted more flexibly) while being small-sized, in comparison with the conventional hinge structure.

Optionally, each of the extension parts may be successively bent to form a prescribed quadrangle (e.g. a rectangle) around the central part. Still optionally, each of the extension parts may also be configured to extend from the central part to form a spiral shape around the central part.

Still optionally, the width W [μm] of the linear body may satisfy the following conditions (1):

$$2 \leq W \leq 4 \tag{1}$$

Still optionally, the thickness T [μm] of the linear body may satisfy the following condition (2):

$$7 \leq T \leq 13 \tag{2}$$

Still optionally, the length L [μm] of the central part may to satisfy the following condition (3):

$$20 \leq L \leq 40 \tag{3}$$

Still Optionally, the space S [μm] between the extension parts may satisfy the following condition (4):

$$4 \leq S \leq 8 \tag{4}$$

BRIEF DESCRIPTION OF THE ACCOMPANYING DRAWINGS

The objects and features of the present invention will become more apparent from the consideration of the following detailed description taken in conjunction with the accompanying drawings, in which.

DETAILED DESCRIPTION OF THE EMBODIMENTS

Figure 1:
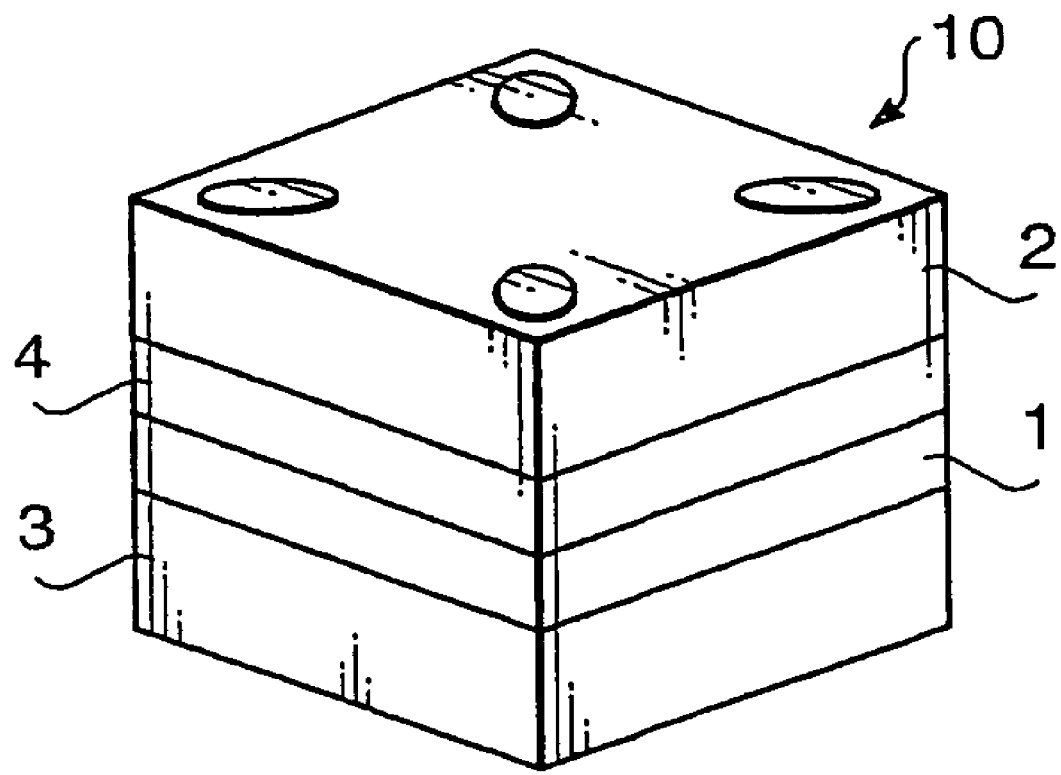
FIG. 1 is a perspective view showing the overall composition of a micromirror device including a hinge structure in accordance with an embodiment of the present invention.
Figure 2:
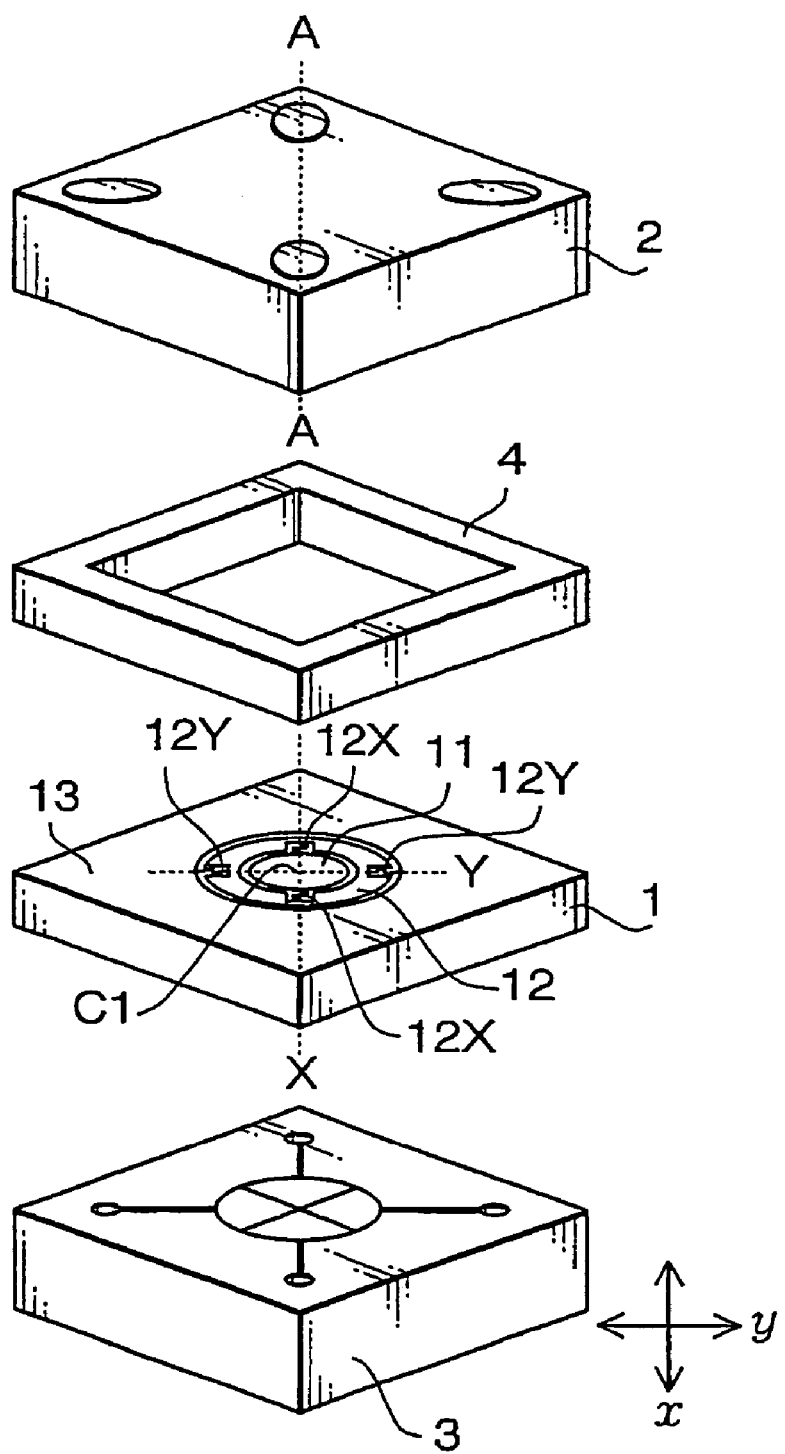
FIG. 2 is a perspective view showing components of the micromirror device in a disassembled state.

Referring now to the drawings, a description will be given in detail of a preferred embodiment in accordance with the present invention. FIG. 1 is a perspective view showing the overall composition of a micromirror device 10 including a hinge structure in accordance with an embodiment of the present invention. FIG. 2 is a perspective view showing components of the micromirror device 10 in a disassembled state. Incidentally, the micromirror device shown in FIGS. 1 and 2 is a biaxial micromirror device capable of rotating the mirror around two axes: a first axis (hereinafter referred to as an "X axis") in a first direction (x direction) and a second axis (hereinafter referred to as a "Y axis") in a second direction (y direction) orthogonal to the first direction.

As shown in FIGS. 1 and 2, the micromirror device 10 includes an upper substrate 2 and a lower substrate 3 stacked up to sandwich a mirror layer 1. The upper substrate 2 is stacked on the mirror layer 1 via a spacer 4, and thus the micromirror device 10 includes the upper substrate 2, the spacer 4, the mirror layer 1 and the lower substrate 3 from its light incident side. In this description, part of the micromirror device 10 in the light incident side is defined as an "upper part" and the other part is defined as a "lower part" for the sake of convenience.

Figure 3:
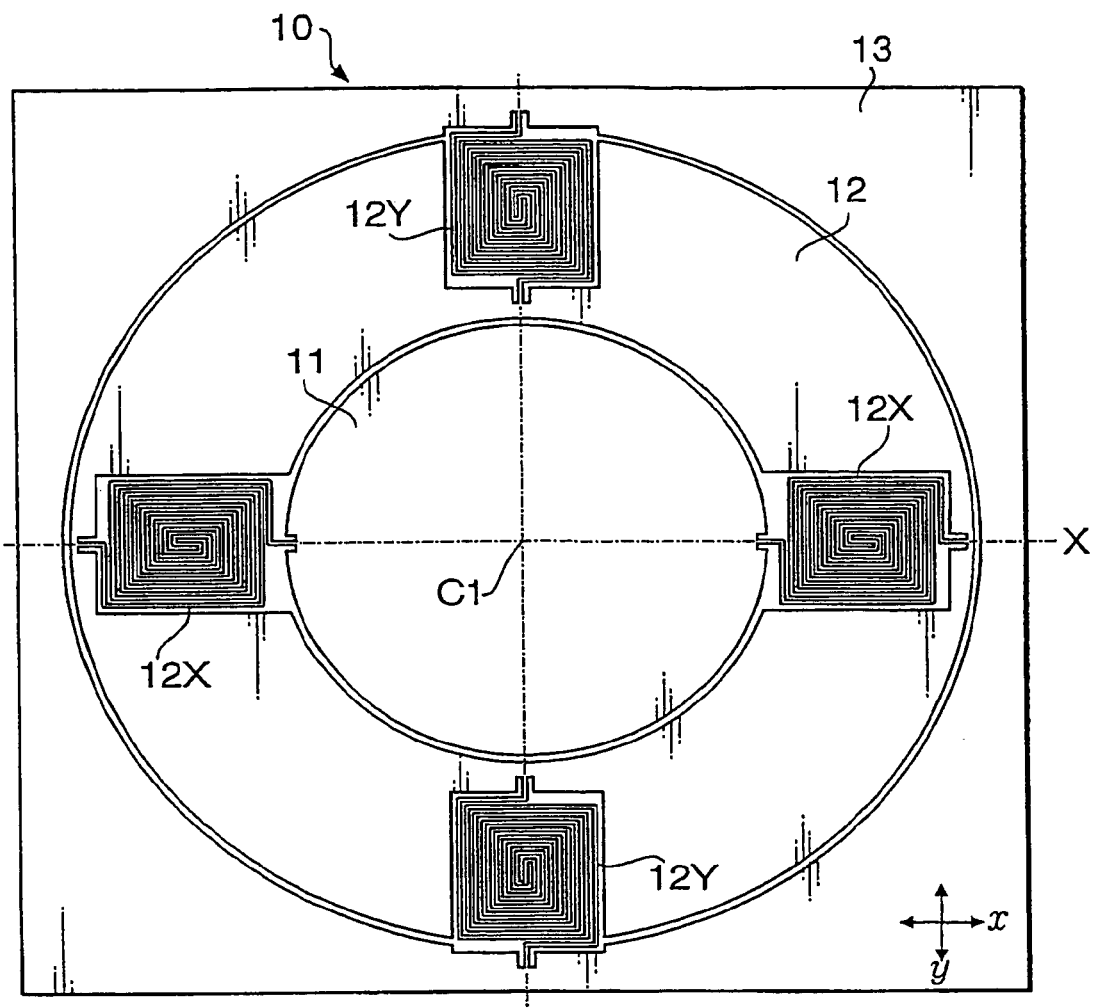
FIG. 3 is an enlarged top view showing a mirror layer of the micromirror device.

FIG. 3 is an enlarged top view showing the mirror layer 1. As shown in FIGS. 2 and 3, the mirror layer 1 includes a circular mirror surface 11 placed in a central part of the mirror layer 1, a ring-shaped frame 12 placed to surround the periphery of the mirror surface 11, and an outer frame 13 formed to surround the frame 12. The frame 12 is provided with a pair of hinge structures 12X arranged in the x direction (hereinafter referred to as "first hinge structures 12X") and another pair of hinge structures 12Y arranged in the y direction (hereinafter referred to as "second hinge structures 12Y").

Each first hinge structure 12X is joined to the mirror surface 11 at one end, while being joined to the frame 12 at the other end. Therefore, the first hinge structures 12X support the mirror surface 11 to be rotatable around the X axis in the x direction. Meanwhile, each second hinge structure 12Y is joined to the frame 12 at one end, while being connected to the outer frame 13 at the other end. Therefore, the second hinge structures 12Y support the frame 12 and the mirror surface 11 to be rotatable around the Y axis in the y direction. In FIG. 3, the X and Y axes are indicated with chain lines (broken lines in FIG. 2) and the intersection of the two axes (the center of the mirror surface 11) is indicated with a reference character "C".

Figure 4:
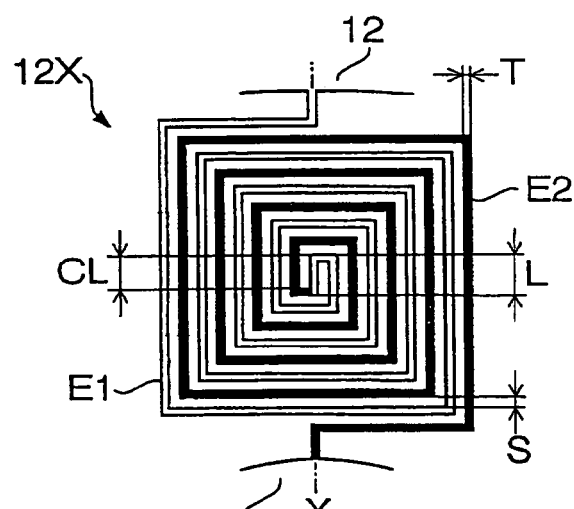
FIG. 4 is an enlarged view showing the overall composition of the hinge structure in accordance with the embodiment.

In the following, the first hinge structure 12X will be explained in detail. FIG. 4 is an enlarged view showing the first hinge structure 12X, in which the X axis is indicated with a broken line. As shown in FIG. 4, the first hinge structure 12X is formed by bending a linear body into a prescribed geometrical shape. The linear body is configured so that its width W [μm] (see FIG. 6) and thickness T [μm] will satisfy the following conditions (1) and (2), respectively:

$$2 \leq W \leq 4 \tag{1}$$

$$7 \leq T \leq 13 \tag{2}$$

The first hinge structure 12X of this embodiment is formed of a linear body having a width W of 3 μm and a thickness T of 10 μm. By forming the first hinge structure 12X with a linear body satisfying the conditions (1) and (2), high spring performance of the first hinge structure 12X is achieved.

Exceeding the upper limits of the conditions (1) and (2) is undesirable since the hinge structure exhibits stiff spring performance and thereby the tilt angle of the mirror surface obtained by a prescribed voltage gets small. Falling below the lower limits of the conditions (1) and (2) is also undesirable although soft spring performance can be obtained. The strength of the hinge structure drops and the structure tends to be damaged or broken.

The first hinge structure 12X formed of a single linear body will be described below partitioning it into three parts: a linear central part CL of a prescribed length and two extension parts E1 and E2 extending from both ends of the central part CL to form prescribed geometrical shapes, for convenience of explanation. In FIG. 4, the extension part E1 is shown as a hollow (outlined) pattern while the extension part E2 is shown as a solidly shaded (black) pattern. The coloring of the patterns in FIG. 4 is only for clarifying the extension parts E1 and E2, that is, for convenience of explanation. Therefore, the coloring in FIG. 4 is irrelevant to the actual configuration of the first hinge structure 12X.

The central part CL is placed along the X axis approximately at the midpoint between a surface rotated around the X axis (mirror surface 11) and a surface that does not rotate around the X axis (frame 12). The length L [μm] of the central part CL is designed to satisfy the following condition (3):

$$20 \leq L \leq 40 \tag{3}$$

In the first hinge structure 12X of this embodiment, the length L of the central part CL is set to 30 μm. By designing the central part CL as a linear part having a length satisfying the condition (3), the first hinge structure 12X can be configured as a structure ensuring a large swing angle (tilt angle) as well as having high strength.

Exceeding the upper limit of the condition (3) is undesirable although soft spring performance can be obtained, since the overall dimension becomes large. Falling below the lower limit of the condition (3) is also undesirable since the hinge structure shows stiff spring performance and thereby the tilt angle of the mirror surface obtained by a prescribed voltage gets small.

The extension part E1 extends from the central part CL to the frame 12 while being successively bent to go around the central part CL in a clockwise direction. Meanwhile, the extension part E2 extends from the central part CL to the mirror surface 11 while being successively bent to go around the central part CL in the same direction as the extension part E1, that is, in the clockwise direction. By the above composition, the first hinge structure 12X can include many parts parallel to the rotation axis. Such a hinge structure including many parts parallel to the rotation axis delivers higher performance compared to the conventional continuous z-fold hinge structure including many parts orthogonal to the rotation axis. Incidentally, the extension parts E1 and E2 are configured so that the space S between them will be substantially constant. The space S [μm] is designed to satisfy the following condition (4):

$$4 \leq S \leq 8 \tag{4}$$

In the first hinge structure 12X of this embodiment, the space S is set to 6 μm. By configuring the extension parts E1 and E2 to have the space S satisfying the condition (4), high spring performance of the first hinge structure 12X can be achieved.

Exceeding the upper limit of the condition (4) is undesirable although soft spring performance is obtained, since the overall dimension becomes large. Falling below the lower limit of the condition (4) is also undesirable since the hinge structure shows stiff spring performance and thereby the tilt angle of the mirror surface for a prescribed voltage decreases.

In this embodiment, each extension part E1, E2 is successively bent substantially at right angles, therefore, the aforementioned "prescribed geometrical shape" formed by each extension part E1, E2 in this case is a rectangle as shown in FIG. 4.

Distal ends of the extension parts E1 and E2 (i.e. both ends of the single linear body forming the first hinge structure 12X) are joined to the surface that does not rotate around the X axis (frame 12) and the surface rotated around the X axis (mirror surface 11), respectively. In this embodiment, a distal end portion of each extension part E1, E2 (extending from the central part CL while being successively bent to go around the central part CL in the clockwise direction) is once bent to go along the X axis and then connected to each surface 12, 11.

The second hinge structure 12Y is configured substantially the same as the first hinge structure 12X described above except for a few points. The main difference from the first hinge structure 12X is that a central part CL of the second hinge structure 12Y is placed along the Y axis and distal ends of extension parts E1 and E2 of the second hinge structure 12Y are joined to a surface rotated around the Y axis (frame 12) and a surface that does not rotate around the Y axis (outer frame 13) respectively.

Figure 6A:
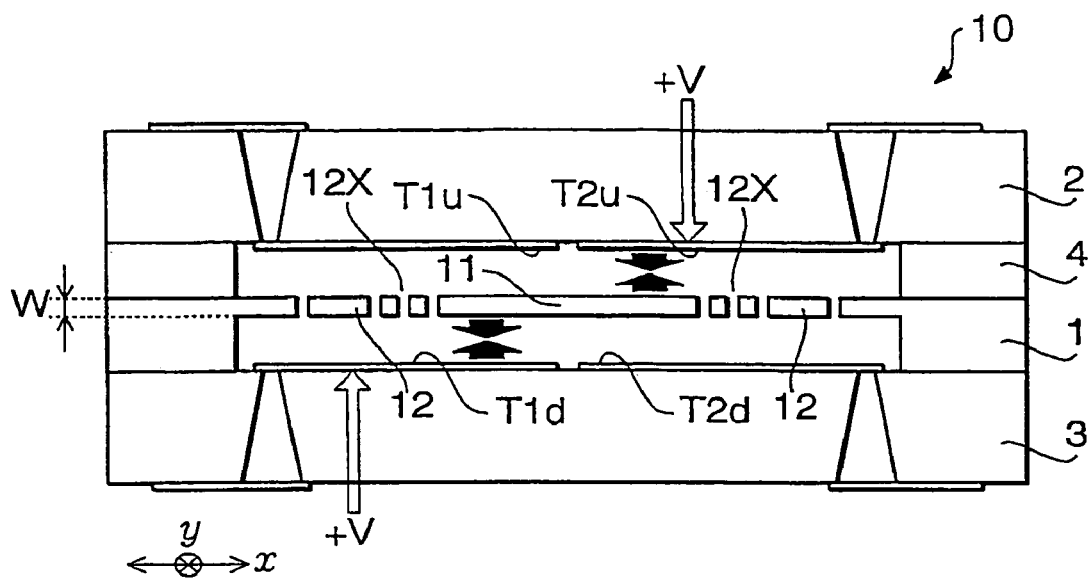
FIGS. 6A and 6B are cross-sectional views explaining the principle of operation of the micromirror device.
Figure 6B:
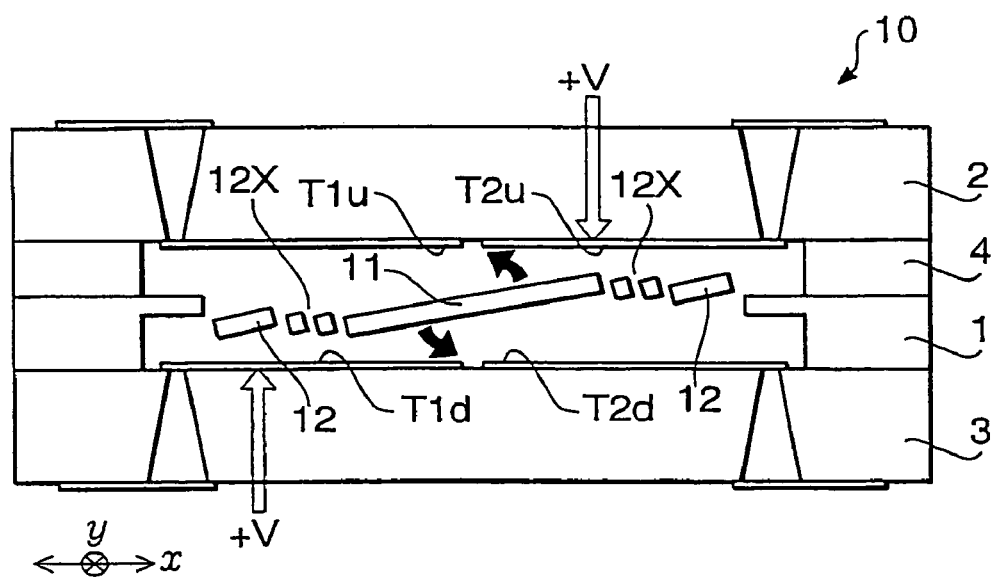

In a peripheral part of the outer frame 13 facing the lower substrate 3, a convex part (protruding downward by a prescribed level difference compared with the central part of the mirror layer 1 where the mirror surface 11 is placed) is formed (see FIGS. 6A and 6B). The convex part is provided to the outer frame 13 in order to secure a prescribed space (hereinafter referred to as a "lower space") between the mirror surface 11 and the lower substrate 3.

The mirror layer 1 configured as above is manufactured by processing an SOI (Silicon On Insulator) wafer by dry etching like RIE (Reactive Ion Etching) or various wet etching techniques. The SOI wafer is composed of three layers: an active or device layer (Si), a box layer ($SiO_2$) and a handle layer (Si). By vapor-depositing a metal layer (Al, Au, etc.) or dielectric multiple layers on the surface of the active layer processed as shown in FIG. 3 by RIE, the mirror layer 1 including the mirror surface 11 of high reflectivity is obtained.

Figure 5C:
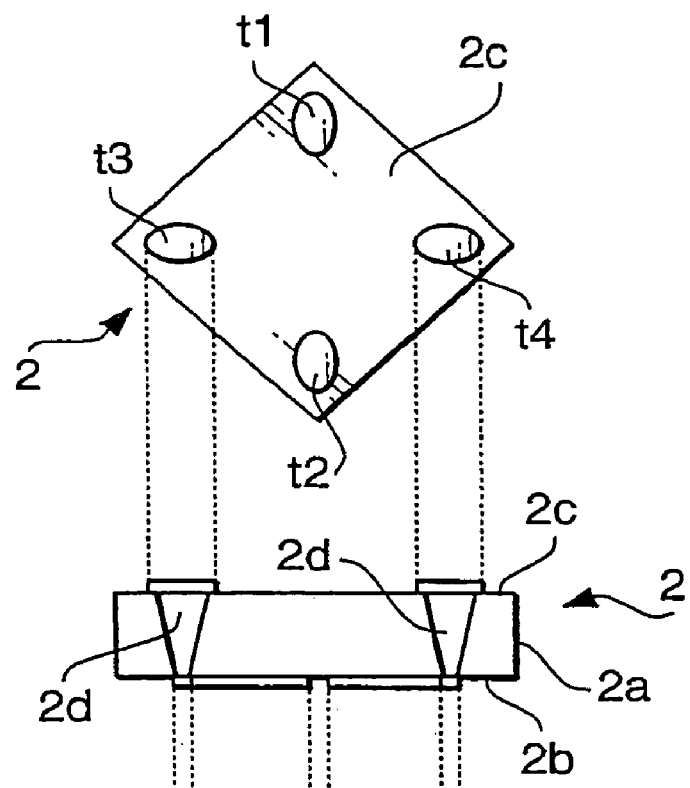
FIG. 5C is a top view of the upper substrate seen from its light incident side.
Figure 5A:
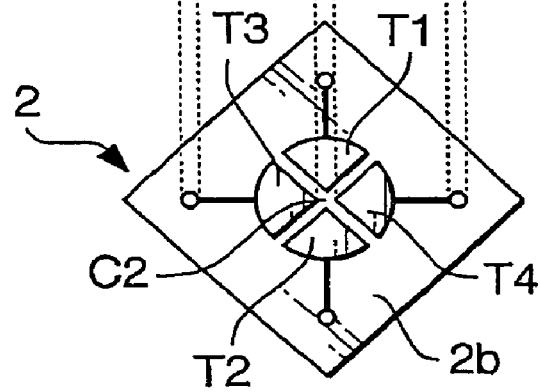
FIG. 5A is a cross-sectional view of an upper substrate of the micromirror device shown in FIG. 2 taken along the line A—A (diagonal line)
Figure 5B:
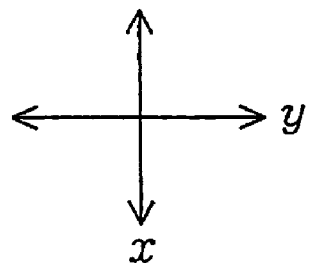
FIG. 5B is a bottom view of the upper substrate seen from the mirror layer's side.

Next, the upper substrate 2 will be explained referring to FIGS. 5A through 5C. FIG. 5A is a cross-sectional view of the upper substrate 2 shown in FIG. 2 taken along the line A—A (diagonal line). FIG. 5B is a bottom view of the upper substrate 2 seen from the mirror layer's side. FIG. 5C is a top view of the upper substrate 2 seen from its light incident side.

The upper substrate 2 is prepared by processing a glass substrate 2a having sufficient transparency allowing a beam led from outside to be incident upon the mirror surface 11. As shown in FIGS. 5A and 5B, first through fourth drive electrodes T1–T4 are formed on a plane surface 2b of the upper substrate 2 facing the mirror layer 1. Each drive electrode T1–T4 is formed as a transparent electrode like an ITO (Indium-Tin-Oxide) film so as not to block the incidence of the beam upon the mirror surface 11. The drive electrodes T1–T4 are shaped into sector forms of the same size. Specifically, first and second drive electrodes T1 and T2 are placed to be symmetrical with each other with respect to a boundary passing through the center C2 of the upper substrate 2 and stretching in the y direction (corresponding to the Y axis of the mirror layer 1). Third and fourth drive electrodes T3 and T4 are placed to be symmetrical with each other with respect to a boundary passing through the center C2 and stretching in the x direction (corresponding to the X axis of the mirror layer 1). As shown in FIGS. 5A and 5C, on a surface 2c of the upper substrate 2 opposite to the surface 2b facing the mirror layer 1, first through fourth wiring electrodes t1–t4 are formed so that voltage supplied from the outside of the micromirror device 10 can be applied to the drive electrodes T1–T4.

The glass substrate 2a is also provided with conducting parts 2d for electrically connecting the wiring electrodes t1–t4 to the drive electrodes T1–T4 respectively. Each conducting part 2d is formed by opening a through hole through the glass substrate 2a by sand blasting, etc. and filling the through hole with a conductive material. The formation of the conducting parts 2d (through holes) by sand blasting is only an example, and thus other techniques can also be used as long as the conducting parts 2d (through holes) can be formed. By the above composition, voltage supplied from the outside of the micromirror device 10 can be applied to the drive electrodes T1–T4 via the conducting parts 2d.

The lower substrate 3 in this embodiment is configured the same as the upper substrate 2 which has been described above. By the common use of the same substrate configuration for the upper and lower substrates 2 and 3, costs can be reduced and efficiency of assembly work can be increased. Further, among the electrodes facing one another via the mirror layer 1 (mirror surface 11), those placed diagonally with respect to the X axis or the Y axis are in symmetrical relationship with each other with respect to the center C1 of the mirror surface 11. Therefore, substantially the same electrostatic force occurs irrespective of which electrode is supplied with a subscribed level of voltage.

The spacer 4 is provided in order to secure a prescribed space (hereinafter referred to as an "upper space") between the upper substrate 2 and the mirror layer 1 (mirror surface 11). Specifically, the spacer 4 is made of silicon to have substantially the same height as the aforementioned convex part of the mirror layer 1. In other words, in the micromirror device 10 of this embodiment, the upper space secured by the spacer 4 has substantially the same height as the lower space secured by the convex part. Therefore, electrostatic force applied to the mirror surface 11 when a certain voltage is applied to an electrode becomes substantially the same regardless of the electrode, and thus no displacement of the mirror surface 11 occurs even when bias voltage is applied to every electrode.

In the stacking of the components 1–4, various well-known joining techniques can be used. In this embodiment, the components 1–4 are joined together by anode junction. Since the spacer 4 and the mirror layer 1 (both made of silicon) can not be joined directly by anode junction, a thin glass layer is placed between the spacer 4 and the mirror layer 1 and the two layers are joined together by anode junction via the glass layer. Incidentally, an error in the height of the upper space caused by the glass layer has no effect in practical use since the glass layer is far thinner than each component 1–4.

In cases where the components 1–4 are vacuum-packaged in the last step of the manufacturing process of the micromirror device 10, the use of a spacer 4 made of Pyrex (registered trademark) glass is desirable. Parts that can not be joined together by anode junction may also be joined by use of polyimide adhesives like Photoneece (registered trademark).

The principle of operation of the micromirror device 10 configured as above will be explained below referring to FIGS. 6A and 6B. FIG. 6A shows the status of the micromirror device 10 before the application of voltage to drive electrodes and FIG. 6B shows the status of the micromirror device 10 with a prescribed voltage applied to drive electrodes. In FIGS. 6A and 6B, for discriminating between the drive electrodes T1–T4 provided to the upper substrate 2 and those provided to the lower substrate 3, drive electrodes of the upper substrate 2 are referred to as "upper drive electrodes T $1u$–T $4u$" while those of the lower substrate 3 are referred to as "lower drive electrodes T $1d$–T $4d$" for the sake of convenience.

To rotate the mirror surface 11 around the Y axis, a prescribed voltage (+V) is applied to a lower drive electrode T$1d$ and an upper drive electrodes T$2u$ as shown in FIG. 6A. By the application of the voltage, electrostatic force (attraction) is caused between the mirror surface 11 and each drive electrode T$1d$, T$2u$ as indicated by solidly shaded arrows in FIG. 6A, by which the mirror surface 11 and the frame 12 rotate around the Y axis formed by a pair of second hinge structures 12Y (see FIG. 2) as shown in FIG. 6B. To rotate the mirror surface 11 around the Y axis in a direction opposite to FIG. 6B, the prescribed voltage (+V) is applied to a lower drive electrode T$2d$ and an upper drive electrodes T$1u$.

As above, the micromirror device 10 of this embodiment rotates the mirror surface 11 (and the frame 12) around the Y axis by simultaneously applying the same voltage to a pair of drive electrodes T$1d$ and T$2u$ or a pair of drive electrodes T$2d$ and T$1u$ which are placed diagonally with respect to the Y axis. Each electrostatic force caused by the application of voltage is applied to the mirror surface 11 substantially as a pure bending moment (rotation moment), as indicated by solidly shaded arrows in FIG. 6B. Therefore, the load on the second hinge structures 12Y and the mirror surface 11 caused by the mirror rotation can be reduced compared to conventional configurations.

Further, by the provision of the drive electrodes to both the upper substrate 2 and the lower substrate 3, a large electrode area can be achieved for the mirror rotation. Moreover, sufficient spaces (upper space, lower space) are secured by the spacer 4 and the convex part of the mirror layer 1. Therefore, the micromirror device 10 of this embodiment can ensure a large tilt angle even if the voltage applied to each electrode is reduced to a low level.

The above is the principle of operation of the micromirror device 10. Incidentally, while only the rotation of the mirror surface 11 around the Y axis has been described above, the rotation of the mirror surface 11 around the X axis is also implemented by substantially the same principle, except for the following points. In the rotation around the X axis, the voltage is applied to a pair of drive electrodes (an upper drive electrode T$3u$ and a lower drive electrode T$4d$, or an upper drive electrode T$4u$ and a lower drive electrode T$3d$) which are placed diagonally with respect to the X axis. Since the first hinge structures 12X serve as the rotation axis, the frame 12 does not rotate in this case.

Figure 7:
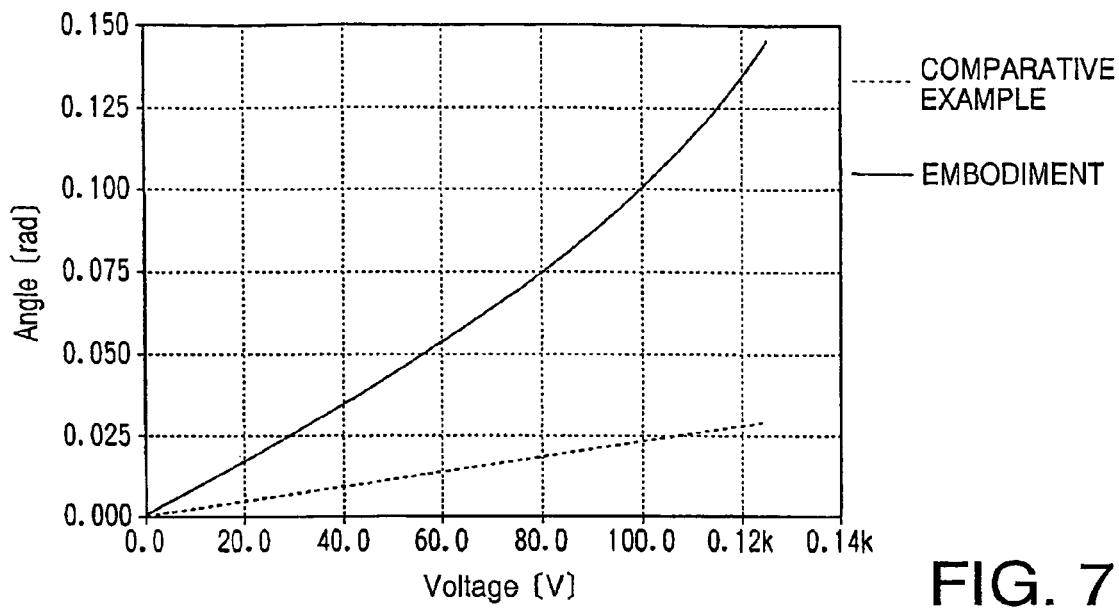
FIG. 7 is a graph showing performance of the micromirror device of the embodiment compared with that of a micromirror device as a comparative example.

In the following, the performance of the micromirror device 10 employing the hinge structures 12X and 12Y of this embodiment is compared with that of a micromirror device (comparative example) employing continuous z-fold hinge structures each of which is formed by alternately folding a linear body satisfying the aforementioned conditions (1) and (2) in directions orthogonal to an axis. In the comparison, each performance figure was obtained by calculation employing the finite element method. FIG. 7 is a graph showing the difference of performance between the micromirror device 10 of this embodiment and the micromirror device as the comparative example, in which the dimensions of each hinge structure in the comparative example are assumed to be substantially equal to those of each hinge structure 12X, 12Y in the micromirror device 10 of this embodiment. In the graph of FIG. 7, the horizontal axis represents the voltage applied to each micromirror device and the vertical axis represents the tilt angle of the mirror surface. The performance (tilt angle) of the micromirror device 10 is indicated with a solid line, while that of the comparative example is indicated with a broken line (ditto for FIG. 8 which will be explained later).

As seen in FIG. 7, when the hinge structures are designed in the same dimensions, the micromirror device 10 having the hinge structures 12X and 12Y achieves a larger tilt angle at lower voltage in comparison with the comparative example.

Figure 8:
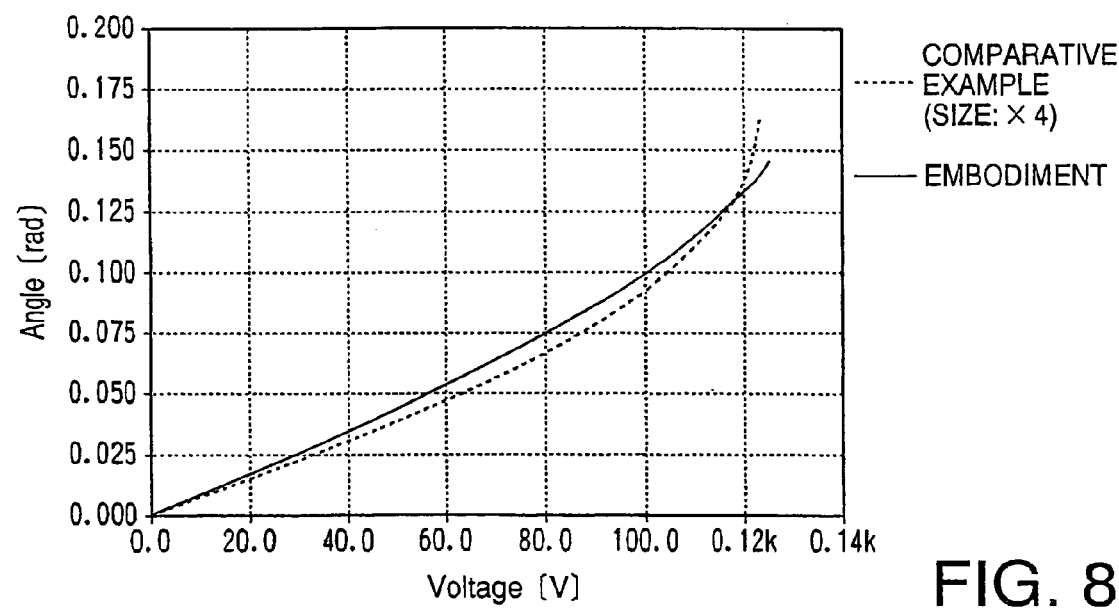
FIG. 8 is a graph showing performance of the micromirror device of the embodiment compared with that of a micromirror device as a comparative example having hinge structures of different sizes.

It is known that the spring performance of a continuous z-fold hinge structure like the one employed in the comparative example can be enhanced by increasing the size of the hinge structure in a direction orthogonal to the rotation axis. Therefore, we examined how large (wide) the hinge structure has to be in the comparative example in order to achieve approximately the same performance as that of the micromirror device 10 of this embodiment. As shown in FIG. 8, it has become clear that the hinge structure in the comparative example has to have approximately four times the size of the hinge structure 12X or 12Y in the direction orthogonal to the rotation axis (approximately four times the area of the hinge structure 12X or 12Y) in order to deliver approximately the same performance as the micromirror device 10 of this embodiment.

The above examination shows that the hinge structure 12X, 12Y of this embodiment delivers higher performance while being small-sized, in comparison with conventional hinge structures. The hinge structure of this embodiment can reduce the ratio of the area of the hinge structures to that of the whole mirror layer. Specifically, the percentage of the area of the four hinge structures in the whole mirror layer 1 is approximately 12% in this embodiment, while that in the comparative example is as high as approximately 36%. Thus, the comparative example can be accompanied by deterioration of the strength of the whole mirror layer, while the hinge structure of this embodiment ensures enough strength of the whole mirror layer 1 as well as achieving a long operating life of the whole micromirror device 10.

While the present invention has been described with reference to the above illustrative embodiment, it is not to be restricted by the particular embodiment but only by the appended claims. It is to be appreciated that those skilled in the art can make various modifications to the embodiment without departing from the scope and spirit of the present invention. For example, the following modifications can also achieve effects similar to those of the above embodiment.

Figure 9:
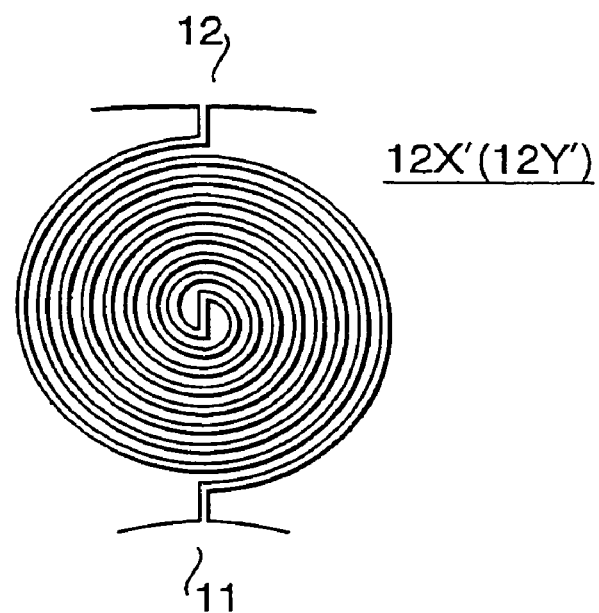
FIG. 9 is a schematic diagram showing a modification of the hinge structure in accordance with the present invention.

While the hinge structure 12X, 12Y of the above embodiment is formed by successively bending the two extension parts E1 and E2 in the clockwise direction to form a rectangle, hinge structures in accordance with the present invention are not restricted to such composition. For example, a hinge structure 12X, 12Y in accordance with the present invention can be formed by successively bending the two extension parts E1 and E2 in the same direction to surround the central part CL. The direction of bending may either be clockwise or counterclockwise. The angle of bend of each extension part is not limited to the right angle as long as the space between the two extension parts E1 and E2 is constant throughout the hinge structure. Further, each extension part E1, E2 may also be curved into a spiral shape around the central part CL as in a hinge structure 12X' (12Y') shown in FIG. 9, instead of folding it. By forming each extension part into a spiral shape, a circular hinge structure can be obtained.

Figure 10:
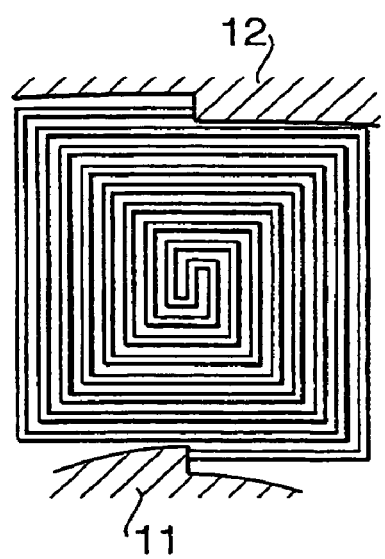
FIG. 10 is a schematic diagram showing another modification of the hinge structure in accordance with the present invention.

In the above embodiment, the distal end portion of each extension part E1, E2 is once bent to go along the rotation axis and then connected to each surface 12, 11, therefore, torque relating to the rotation of the mirror surface 11 originates from a "twist" in the distal end portion of each extension part. A hinge structure in accordance with the present invention may also be configured so that the torque will originate from a "bend" in the distal end portion of each extension part as in a modification shown in FIG. 10.

While the hinge structure of the above embodiment is suitably employed for a micromirror device of the capacitance type, the hinge structure in accordance with the present invention is also applicable to various types of micromirror devices such as those driven by electromagnetic force, piezoelectric elements, etc.

The present disclosure relates to the subject matter contained in Japanese Patent Application No. 2004-017907, filed on Jan. 27, 2004, which is expressly incorporated herein by reference in its entirety.

What is claimed is:

1. A hinge structure for rotatably supporting a mirror surface of a micromirror device which rotates the mirror surface around at least an axis for scanning a beam, comprising a linear body with one end joined to a surface which is rotated around the axis and the other end joined to a surface which does not rotate around the axis, the linear body including:
a linear central part situated on the axis; and
a pair of extension parts extending from both ends of the central part to both ends of the linear body respectively to surround the central part in the same direction,
the extension parts being formed so that space between them will be substantially constant.

2. The hinge structure according to claim 1, wherein each of the extension parts is successively bent to form a prescribed quadrangle around the central part.

3. The hinge structure according to claim 2, wherein the prescribed quadrangle is substantially a rectangle.

4. The hinge structure according to claim 1, wherein each of the extension parts extends from the central part to form a spiral shape around the central part.

5. The hinge structure according to claim 1, wherein a width W (μm) of the linear body satisfies the following condition (1):

$$2 \leq W \leq 4 \qquad (1).$$

6. The hinge structure according to claim 1, wherein a thickness T (μm) of the linear body satisfies the following condition (2):

$$7 \leq T \leq 13 \qquad (2).$$

7. The hinge structure according to claim 1, wherein a length L (μm) of the central part satisfies the following condition (3):

$$20 \leq L \leq 40 \qquad (3).$$

8. The hinge structure according to claim 1, wherein the space S (μm) between the extension parts satisfies the following condition (4):

$$4 \leq S \leq 8 \qquad (4).$$

9. A hinge structure for rotatably supporting a mirror surface of a micromirror device which rotates the mirror surface around at least an axis for scanning a beam, comprising a linear body with one end joined to a surface which is rotated around the axis and the other end joined to a surface which does not rotate around the axis, the linear body including:
a linear central part situated on the axis;
a first extension part extending from an end of the central part to the one end of the linear body to surround the central part in one of a clockwise direction and a counterclockwise direction; and
a second extension part extending from the other end of the central part to the other of the linear body to surround the central part in the same direction as the first extension part,
the first and second extension parts being formed so that space between them will be substantially constant.

* * * * *